(12) United States Patent
Burnett et al.

(10) Patent No.: US 7,718,485 B2
(45) Date of Patent: May 18, 2010

(54) INTERLAYER DIELECTRIC UNDER STRESS FOR AN INTEGRATED CIRCUIT

(75) Inventors: James D. Burnett, Austin, TX (US); Jon D. Cheel, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 322 days.

(21) Appl. No.: 11/754,728

(22) Filed: May 29, 2007

(65) Prior Publication Data

US 2007/0218618 A1 Sep. 20, 2007

Related U.S. Application Data

(62) Division of application No. 11/100,168, filed on Apr. 6, 2005, now Pat. No. 7,238,990.

(51) Int. Cl.
*H01L 21/8238* (2006.01)

(52) U.S. Cl. .................. 438/230; 257/369; 257/E21.64

(58) Field of Classification Search .................. 438/230; 257/369, E21.64

See application file for complete search history.

(56) References Cited

U.S. PATENT DOCUMENTS

| | | | |
|---|---|---|---|
| 6,882,025 B2 * | 4/2005 | Yeo et al. ..................... 257/510 |
| 7,348,284 B2 * | 3/2008 | Doyle et al. ................. 438/142 |
| 7,545,002 B2 * | 6/2009 | Maeda et al. ................ 257/368 |
| 2002/0197823 A1 | 12/2002 | Yoo et al. |
| 2003/0181005 A1 * | 9/2003 | Hachimine et al. .......... 438/231 |
| 2005/0093081 A1 * | 5/2005 | Belyansky et al. .......... 257/392 |
| 2005/0263825 A1 * | 12/2005 | Frohberg et al. ............ 257/369 |
| 2005/0266632 A1 * | 12/2005 | Chen et al. .................. 438/233 |

OTHER PUBLICATIONS

PCT Search report and Written Opinion for corresponding PCT Application No. PCT/US06/05369 mailed Jun. 13, 2008.

* cited by examiner

*Primary Examiner*—Steven J Fulk
(74) *Attorney, Agent, or Firm*—James L. Clingan, Jr.

(57) ABSTRACT

An integrated circuit that has logic and a static random access memory (SRAM) array has improved performance by treating the interlayer dielectric (ILD) differently for the SRAM array than for the logic. The N channel logic and SRAM transistors have ILDs with non-compressive stress, the P channel logic transistor ILD has compressive stress, and the P channel SRAM transistor at least has less compressive stress than the P channel logic transistor, i.e., the P channel SRAM transistors may be compressive but less so than the P channel logic transistors, may be relaxed, or may be tensile. It is beneficial for the integrated circuit for the P channel SRAM transistors to have a lower mobility than the P channel logic transistors. The P channel SRAM transistors having lower mobility results in better write performance; either better write time or write margin at lower power supply voltage.

3 Claims, 9 Drawing Sheets

INTERLAYER DIELECTRIC UNDER STRESS FOR AN INTEGRATED CIRCUIT

FIELD OF THE INVENTION

This invention relates to integrated circuits, and more particularly to integrated circuits that have an interlayer dielectric that is stressed to improve performance of the integrated circuits.

BACKGROUND OF THE INVENTION

One of the techniques that has been under development to improve transistor mobility is strained silicon. Typically the silicon layer is put under tensile stress to improve the N channel mobility. This has been extended to using an interlayer dielectric (ILD), a dielectric layer between conductive layers, that is under a selected stress to improve transistor performance. For N channel transistors this has meant using tensile stress, and for P channel transistors this has meant using compressive stress.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect an integrated circuit that has both logic and a static random access memory (SRAM) array has improved performance by treating the interlayer dielectric (ILD) differently for the SRAM array than for the logic. The N channel logic and N channel SRAM transistors both have ILDs with non-compressive stress, the P channel transistor ILD has compressive stress, and the P channel SRAM transistors at least have less compressive stress than the P channel logic transistors, i.e., the P channel SRAM transistors may be compressive but with less magnitude of such compressive stress than the logic P channel transistors, may be relaxed, or may be tensile. It has been found to be advantageous for the integrated circuit for the P channel SRAM transistors to have a lower mobility than the P channel logic transistors. The P channel SRAM transistors having lower mobility results in better write performance; either better write time or write margin at lower power supply voltage. This is better understood by reference to the drawings and the following description.

Figure 1:
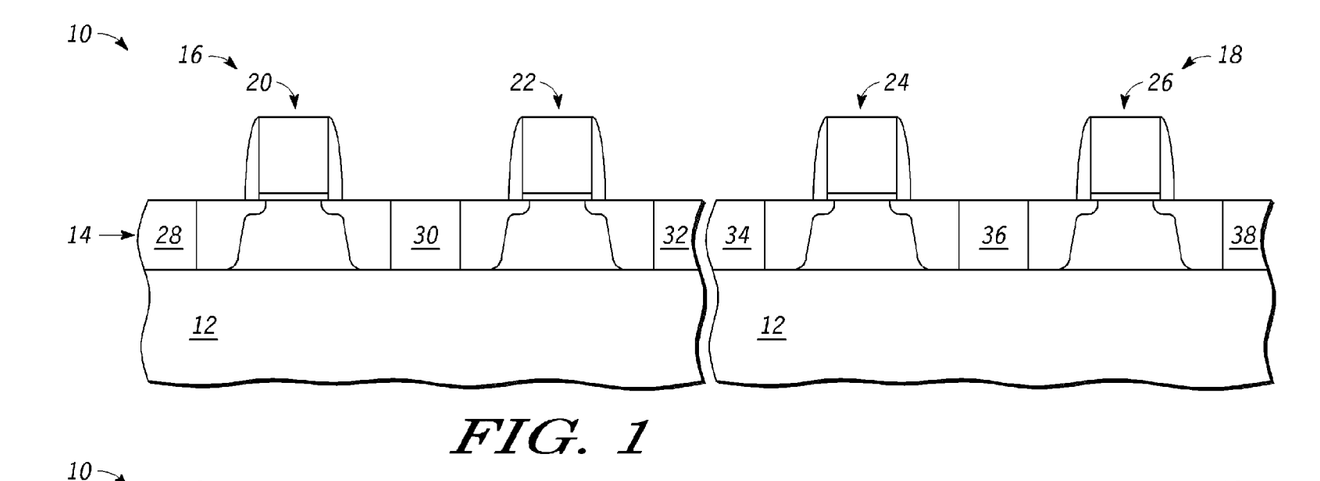
FIG. 1 is a cross section of a semiconductor structure at a stage in processing according to multiple embodiments of the invention.

Shown in FIG. 1 is a semiconductor device 10 comprising using an SOI substrate comprising a relatively thick insulating layer 12 and a semiconductor layer 14. Semiconductor layer 14 is preferably silicon but could be another semiconductor material such as silicon germanium or silicon carbon. Insulating layer 12 is preferably oxide but could be another insulating material.

Semiconductor device 10 has built therein a logic region 16 and an SRAM array region 18. Shown in FIG. 1, logic portion 16 comprises an N channel transistor 20 and a P channel transistor 22. Transistors 20 and 22 are representative of many other, typically millions, N and P channel transistors that would be present on a typical integrated circuit for the purpose of forming logic function circuits such as logic gates, registers, and processing units, as well as other logic function circuits. Similarly shown in FIG. 1, SRAM array portion 18 comprises an N channel transistor 24 and a P channel transistor 26. Transistors 24 and 26 are similarly representative of many other, typically millions, N and P channel transistors that would form an SRAM array. Logic transistors 20 and 22 are isolated from each other and other transistors by isolation regions 28, 30, and 32 formed in semiconductor layer 14. Similarly SRAM transistors 24 and 26 are separated from each other and other SRAM transistors by isolation regions 34, 36, and 38.

Figure 2:
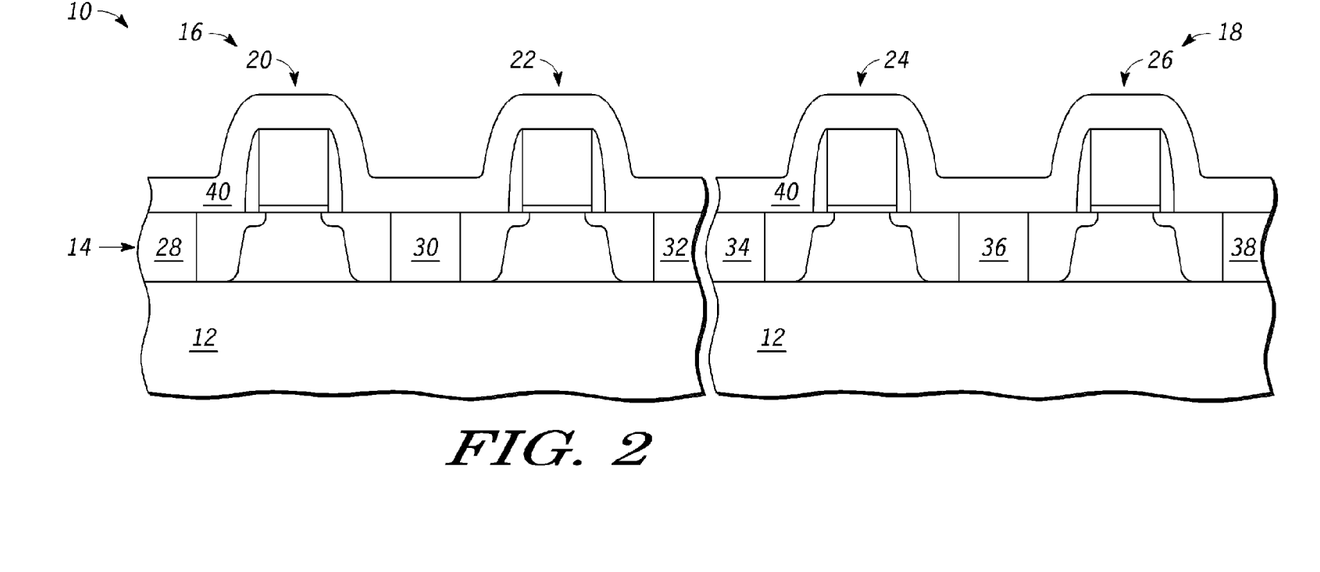
FIG. 2 is a cross section of the semiconductor structure of FIG. 1 at a subsequent stage in processing according to first, second, third, and fourth embodiments of the invention.

Shown in FIG. 2 is semiconductor device 10 after deposition of a dielectric layer 40 over logic portion 16 and SRAM array portion 18. Dielectric layer 40 is deposited with tensile stress. An exemplary material of dielectric layer 40 is silicon nitride deposited by plasma-enhanced chemical vapor deposition (PECVD). The amount of tensile stress is selectable based on the parameters of the deposition. Dielectric layer 40 has a thickness of about half the height of the gate of transistors 20, 22, 24, and 26. In this example, that would make dielectric layer 40 about 500 Angstroms in thickness.

Figure 3:
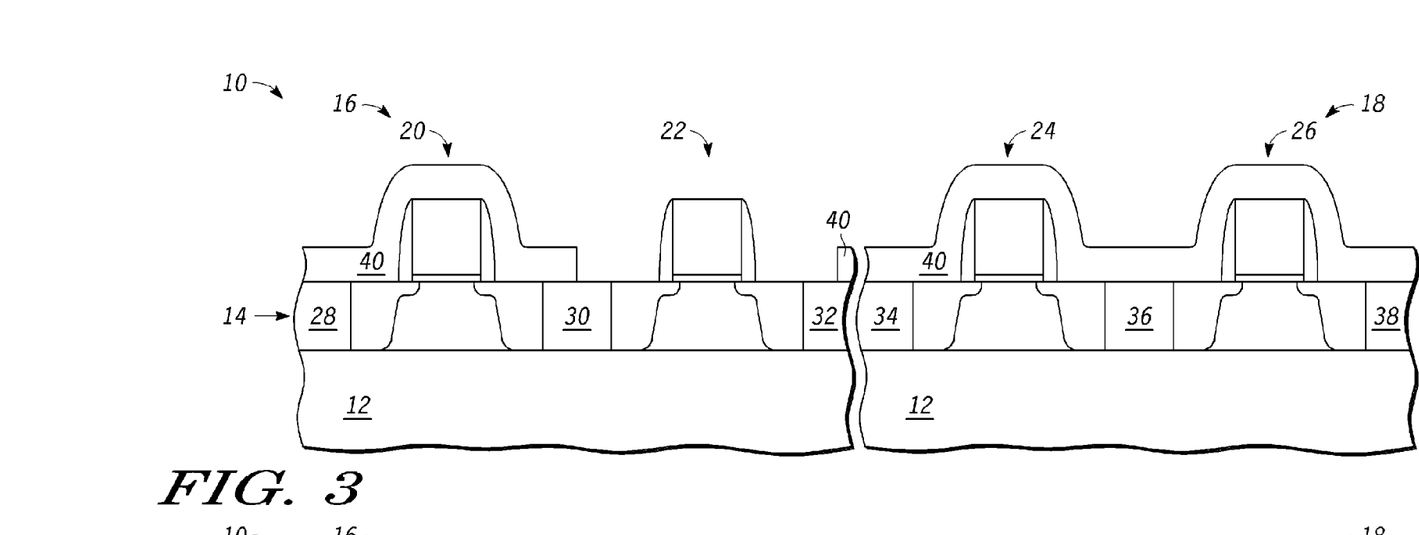
FIG. 3 is a cross section of the semiconductor structure of FIG. 2 at a subsequent stage in processing according to the first and fourth embodiments of the invention.

Shown in FIG. 3 is semiconductor device 10 after selectively removing dielectric layer from transistor 22, which is a P channel transistor, which suffers a reduction in mobility with tensile stress.

Figure 4:
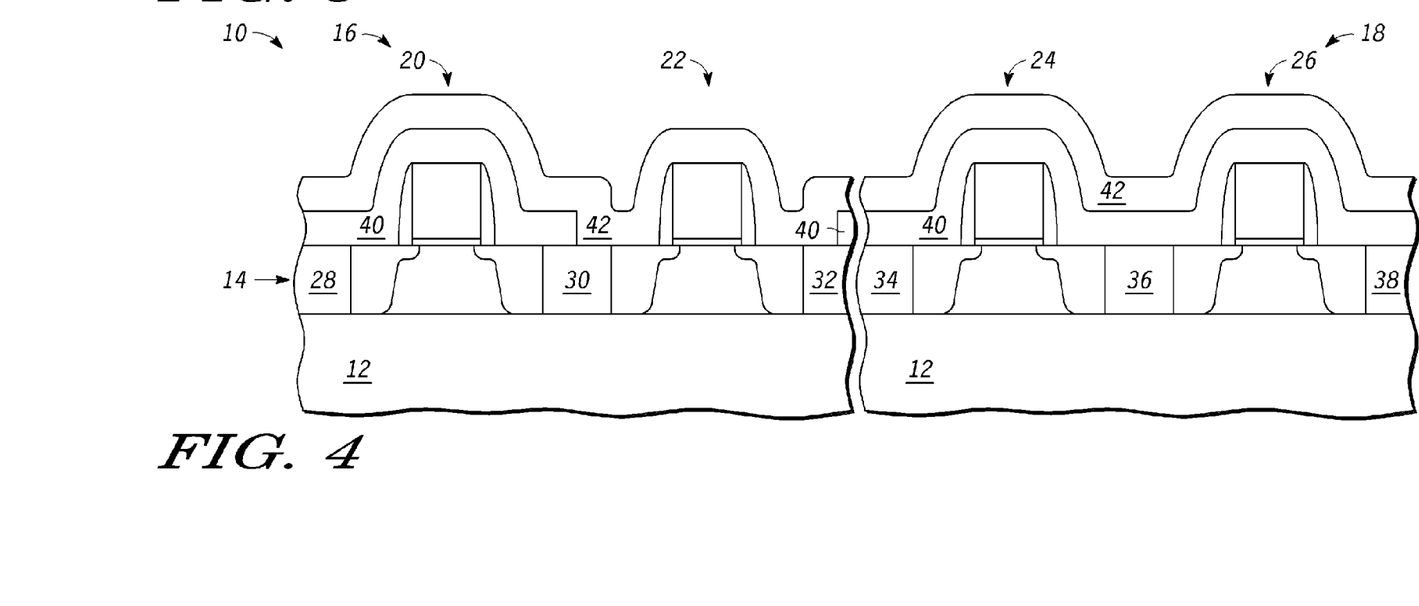
FIG. 4 is a cross section of the semiconductor structure of FIG. 3 at a subsequent stage in processing according to the first and fourth embodiments of the invention.

Shown in FIG. 4 is semiconductor device 10 after deposition of a dielectric layer 42 over logic portion 16 and SRAM array portion 18. Dielectric layer 42 is deposited with compressive stress and of substantially the same thickness as dielectric layer 40. Dielectric layer 42 is also preferably silicon nitride deposited by PECVD but with the parameters chosen to make it compressive.

Figure 5:
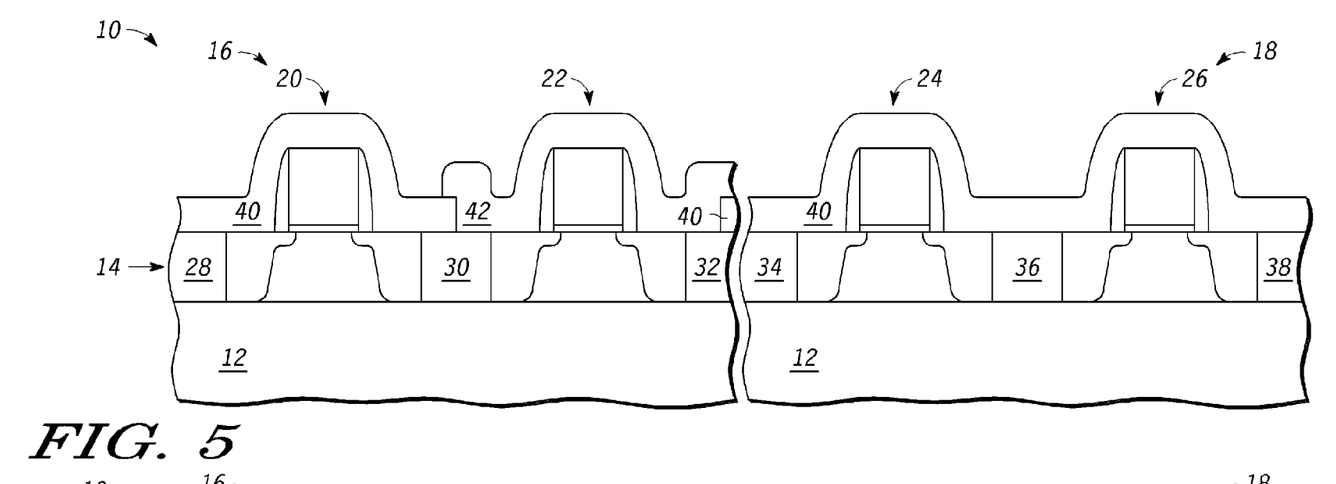
FIG. 5 is a cross section of the semiconductor structure of FIG. 4 at a subsequent stage in processing according to the first and fourth embodiments of the invention.

Shown in FIG. 5 is semiconductor device 10 after selectively etching dielectric layer 42 so that dielectric layer 42 remains only over transistor 22 with a small overlap over dielectric layer 40. The etch, although done with a mask step, does result in dielectric layer 40 being exposed to the etch after dielectric layer 42 has been etched through. Because both dielectric layers 40 and 42 are of similar composition, silicon nitride formed with different parameters, there is a small selectivity between the two layers. Thus, this is preferably a timed etch. It may be desirable to form dielectric layer 40 to a little more thickness than dielectric layer 42 to account for some over-etch into dielectric layer 40. The result at this point is that N channel transistors 20 and 24 have an ILD that is tensile, the SRAM P channel has an ILD that is tensile, and the logic P channel has an ILD that is compressive. This provides for enhanced mobility for transistors 20, 22, and 24 and reduced mobility for transistor 26. Transistor 26, as a P channel transistor in an SRAM array, is used as a pull-up transistor. Such pull-up transistor with lower mobility improves write performance. This write performance can be either in the write margin for low power supply voltage applications or for a faster write.

Figure 6:
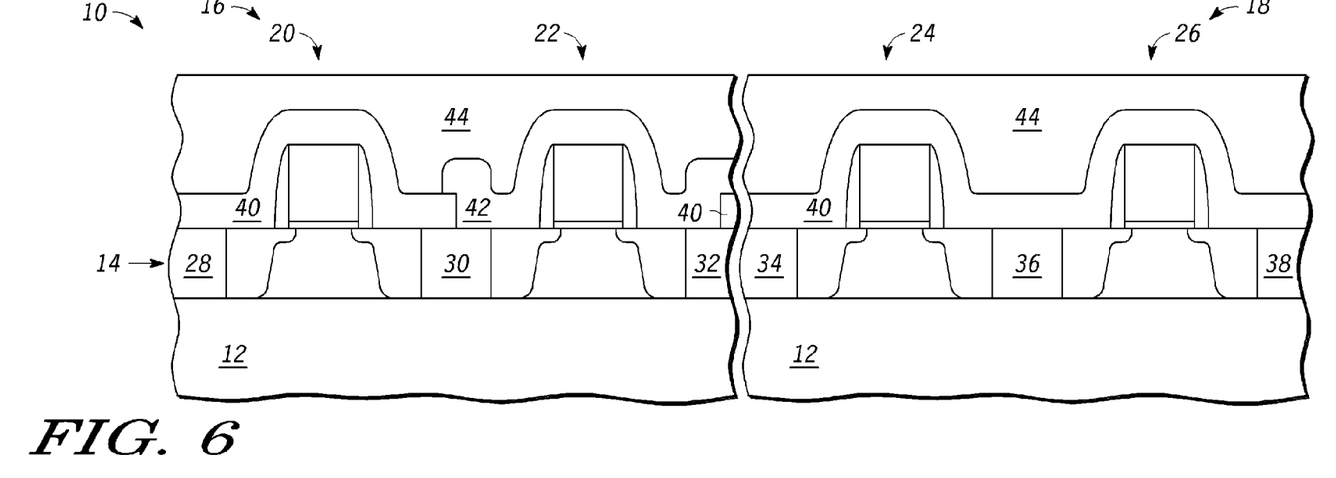
FIG. 6 is a cross section of the semiconductor structure of FIG. 5 at a subsequent stage in processing according to the first embodiment of the invention.

Shown in FIG. 6 is semiconductor device 10 after formation of a dielectric layer 44 that completes formation of an ILD over transistors 20, 22, 24, and 26. Dielectric layer 44 is preferably an oxide such as TEOS or another oxide such as doped glass or even another insulating type of material. Dielectric layer 44 is preferably of a material that can be planarized and has a stress that is or is nearly relaxed. After completion of dielectric layer 44, metal layer formation can proceed for providing interconnect for the integrated circuit.

Figure 7:
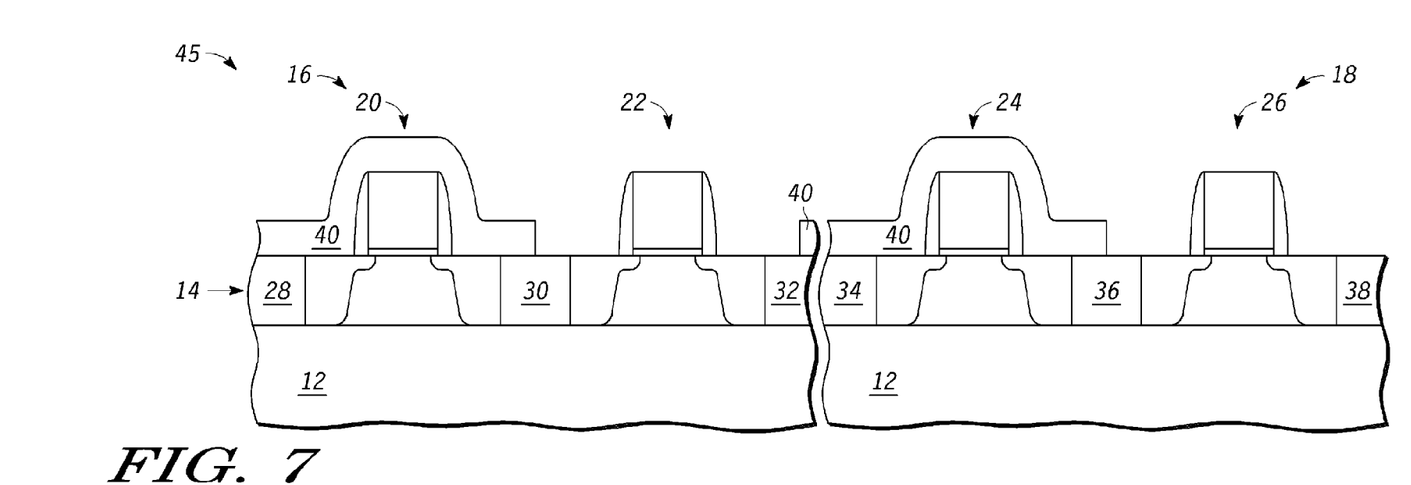
FIG. 7 is a cross section of the semiconductor structure of FIG. 2 at a subsequent stage in processing according to the second and third embodiments of the invention.

Shown in FIG. 7 is a semiconductor device 45 that follows from semiconductor device 10 of FIG. 2 after an etch that removes dielectric layer from over transistor 26 as well as transistor 22. Analogous features from FIGS. 1-6 are retained for FIG. 7.

Figure 8:
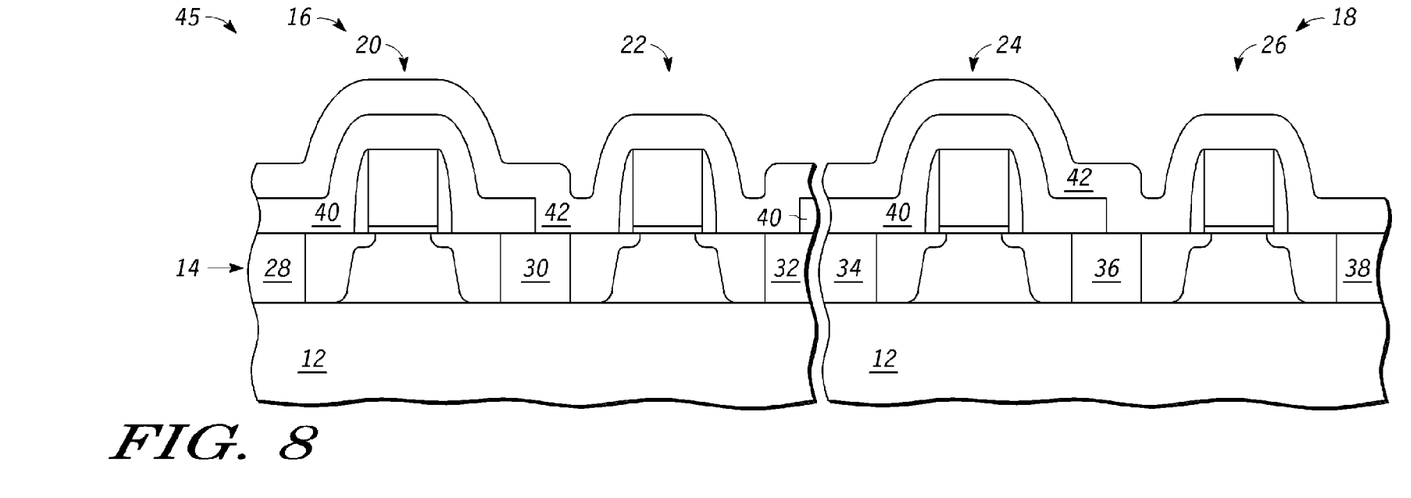
FIG. 8 is a cross section of the semiconductor structure of FIG. 7 at a subsequent stage in processing according to the second and third embodiments of the invention.

Shown in FIG. 8 is semiconductor device 45 after deposition of dielectric layer 42, which deposition is the same as shown in FIG. 4, over transistors 20, 22, 24, and 26.

Figure 9:
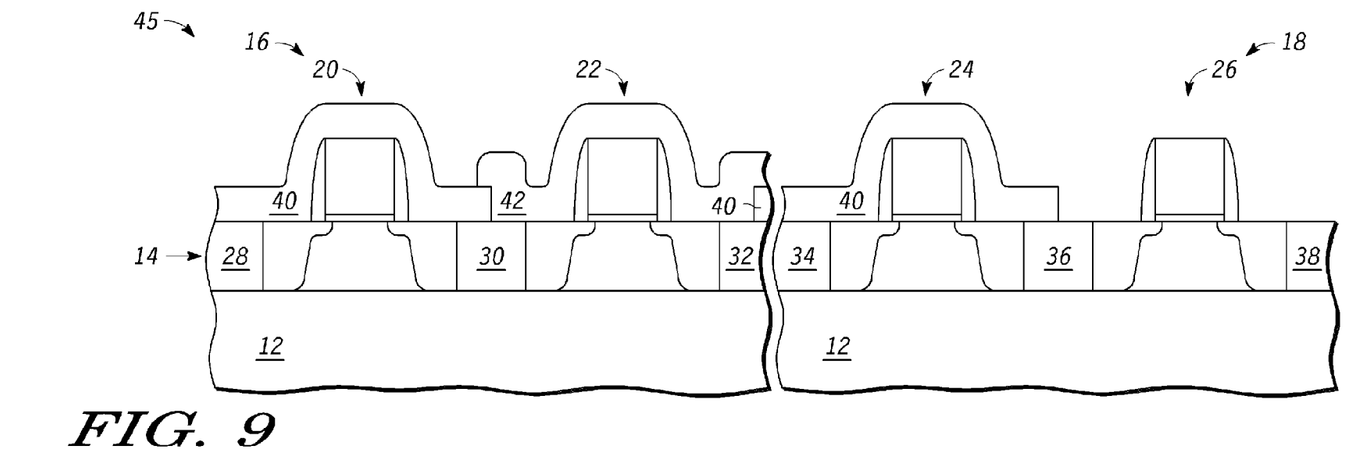
FIG. 9 is a cross section of the semiconductor structure of FIG. 8 at a subsequent stage in processing according to the second embodiment of the invention.

Shown in FIG. 9 is semiconductor device 45 after selectively removing layer 42 from over transistors 20, 24, and 26. The partial removal of dielectric layer 42 is performed in the same as in FIG. 5. The result in this case is that transistor 26 does not have a dielectric layer in the manner that transistors 20, 22, and 24 have.

Figure 10:
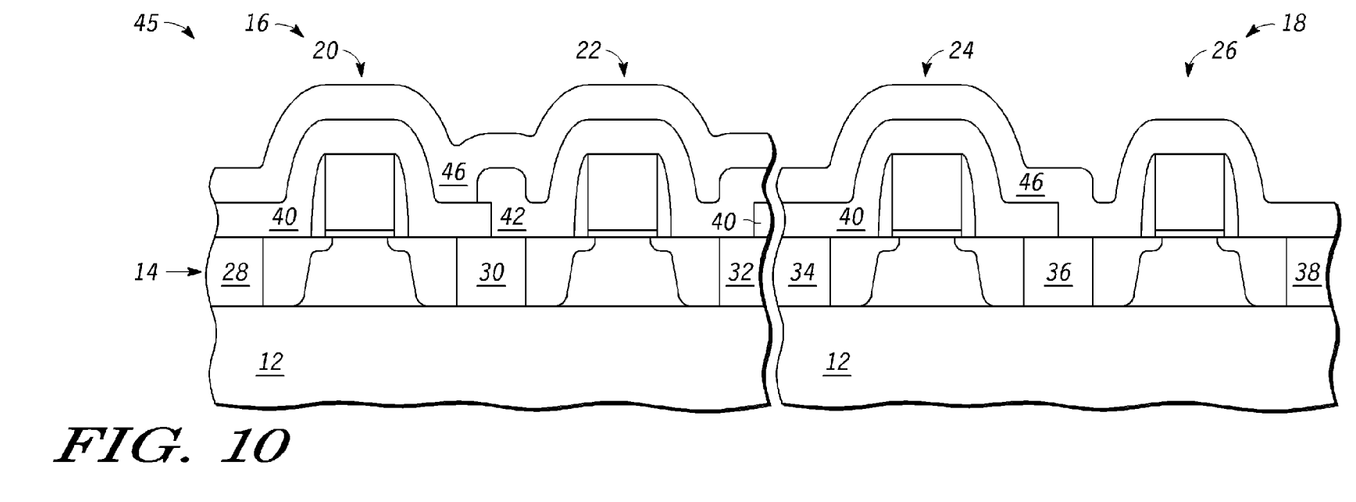
FIG. 10 is a cross section of the semiconductor structure of FIG. 9 at a subsequent stage in processing according to the second embodiment of the invention.

Shown in FIG. 10 is semiconductor device 45 after deposition of a dielectric layer 46 over logic portion 16 and SRAM array portion 18. This dielectric layer is also substantially the same thickness as dielectric layers 40 and 42 is also silicon nitride deposited by PECVD. In this case the deposition parameters are chosen so that dielectric layer 46 is at least less compressive than dielectric layer 42. This means that dielectric layer 46 is one of compressive but less compressive than dielectric layer 42, relaxed, or tensile. If tensile, this would preferably be of an amount different than that of dielectric layer 40.

Figure 11:
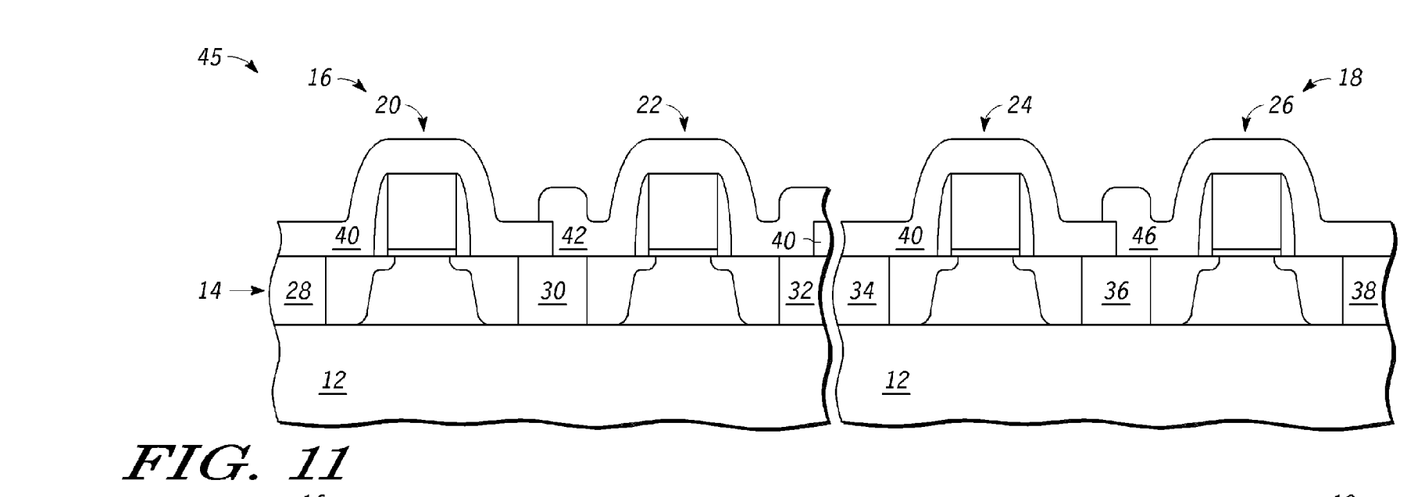
FIG. 11 is a cross section of the semiconductor structure of FIG. 10 at a subsequent stage in processing according to the second embodiment of the invention.

Shown in FIG. 11 is semiconductor device 45 after dielectric layer 46 has been selectively removed from over transistors 20, 22, and 24. This results in N channel transistors 20 and 24 having an ILD that is tensile, P channel transistor 22 having an ILD that is compressive, and P channel transistor 46 having an ILD that is at least less compressive than that of transistor 42. The SRAM cells thus have a pull-up transistor that has less mobility than the P channel transistor used in the logic portion of the integrated circuit. This is beneficial for SRAM cells and results in improved write margin or write speed.

Figure 12:
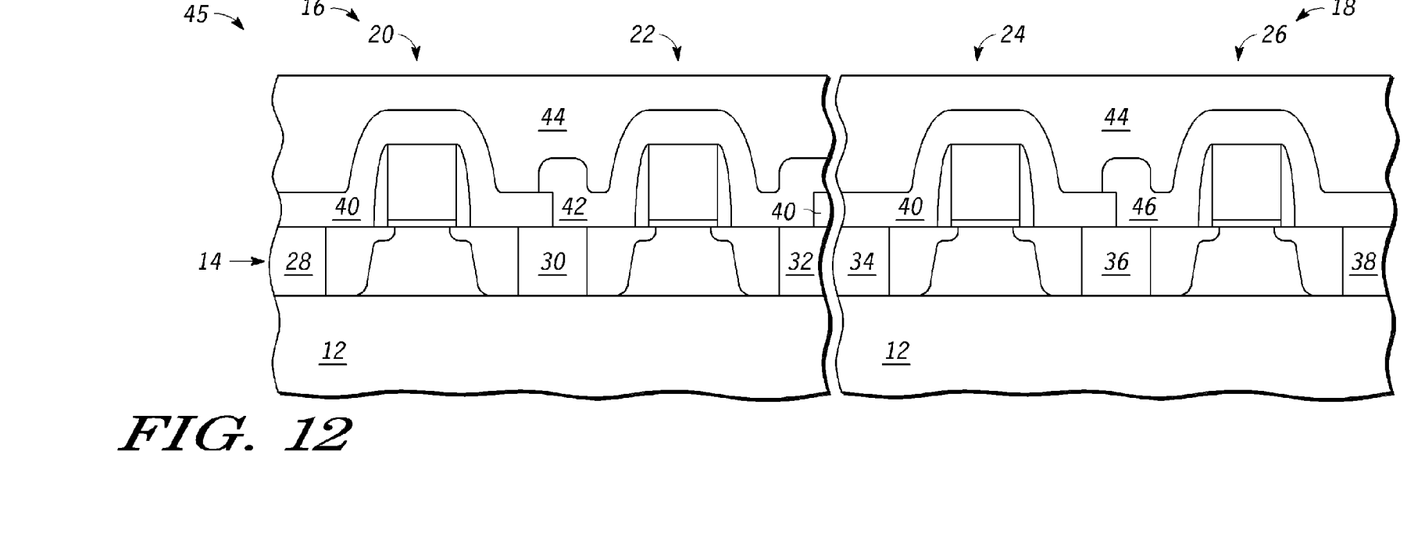
FIG. 12 is a cross section of the semiconductor structure of FIG. 11 at a subsequent stage in processing according to the second embodiment of the invention.

Shown in FIG. 12 is semiconductor device 45 with a completed ILD showing the formation of a dielectric layer 44, which is planar, over transistors 20, 22, 24, and 26. Metal interconnect formation can proceed over dielectric layer 44.

Figure 13:
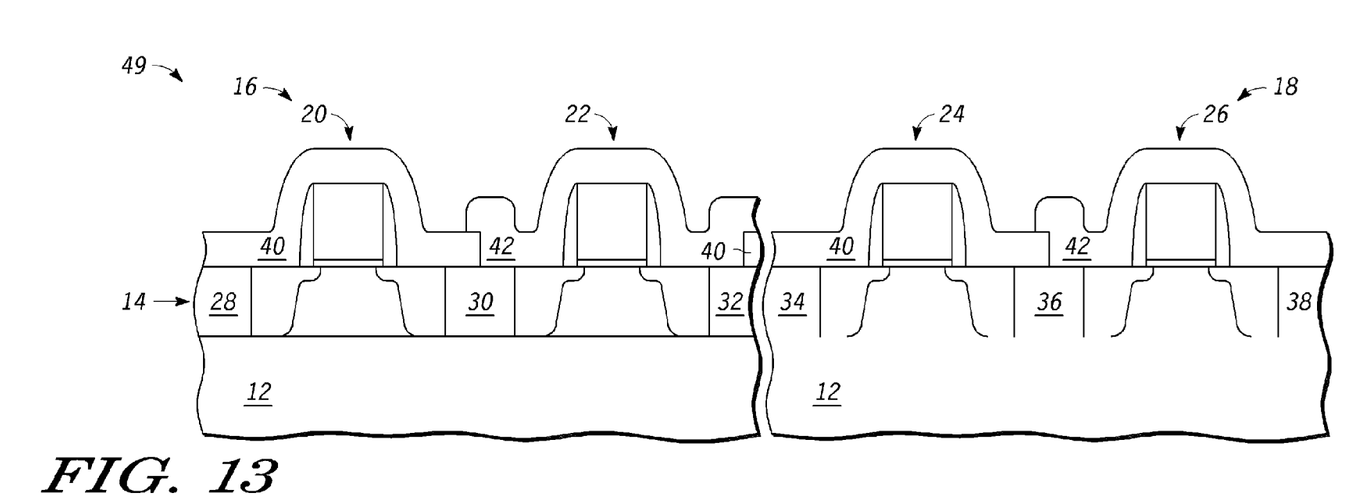
FIG. 13 is a cross section of the semiconductor structure of FIG. 8 at a subsequent stage in processing according to the third embodiment of the invention.

Shown in FIG. 13 is a semiconductor device 49 that follows from semiconductor device 45 of FIG. 8 after an etch that removes dielectric layer 42 from over transistors 20 and 24 so that dielectric layer 42 remains over transistors 22 and 26. Analogous features from FIGS. 1-12 are retained for FIG. 13. At this stage P channel transistors 22 and 26 have the same compressive stress.

Figure 14:
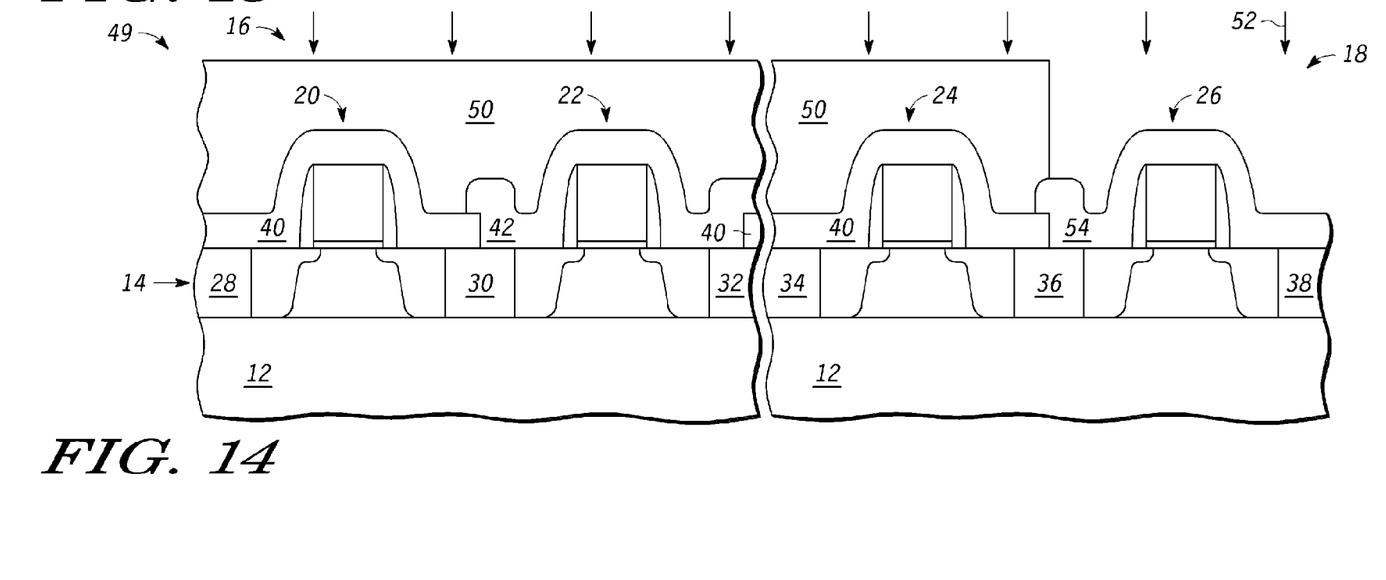
FIG. 14 is a cross section of the semiconductor structure of FIG. 13 at a subsequent stage in processing according to the third embodiment of the invention.

Shown in FIG. 14 is semiconductor device 49 after forming an implant mask 50 over transistors 20, 22, and 24 and implanting with an implant 52 into dielectric layer 42 to cause it to convert to a dielectric layer 54 that at least has less compressive stress than dielectric layer 42. Implant mask 50 is preferably photoresist but could be another appropriate material. Implant 52 is preferably xenon but could be another implant species that would have the effect of reducing the amount of compressive stress of dielectric layer 54. This implant is particularly useful in causing dielectric layer 42 to become relaxed. The result of the implant is to have P channel pull-ups in the SRAM cells that have less mobility and thus result in improved write margin or improved write speed.

Figure 15:
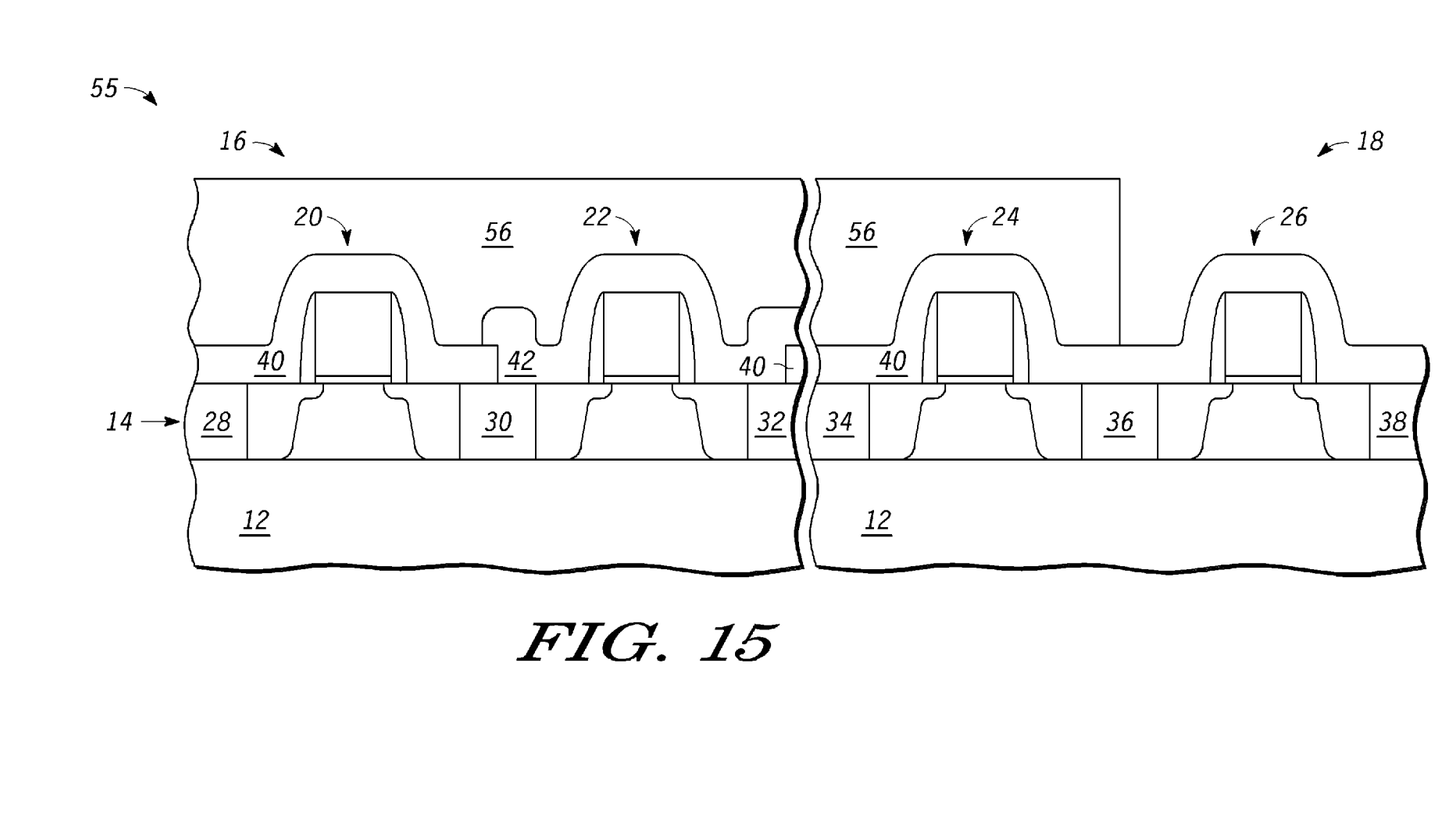
FIG. 15 is a cross section of the semiconductor structure of FIG. 5 at a subsequent stage in processing according to the fourth embodiment of the invention.

Shown in FIG. 15 is a semiconductor device 55 that follows from semiconductor device 10 of FIG. 5 after formation of an implant mask 56 is formed over transistors 20, 22, and 24. Analogous features from FIGS. 1-6 are retained for FIG. 13. This shows that a portion of dielectric layer 40 that is over transistor 26 is exposed.

Figure 16:
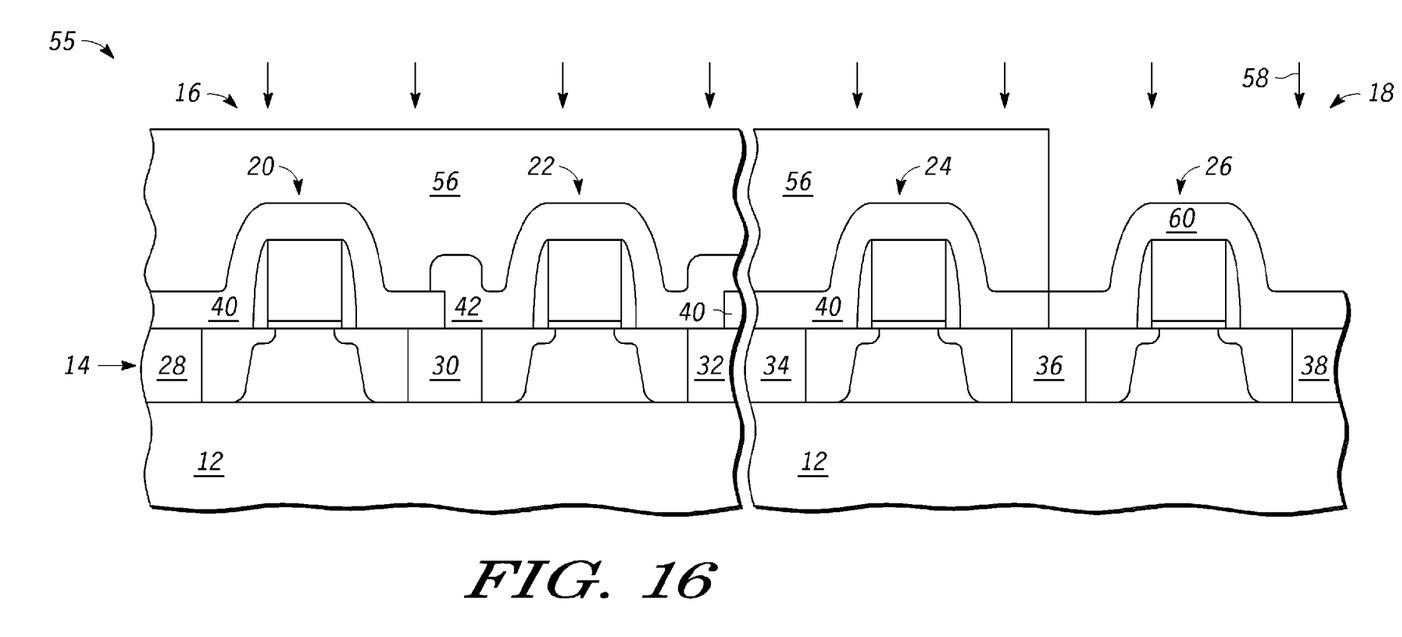
FIG. 16 is a cross section of the semiconductor structure of FIG. 15 at a subsequent stage in processing according to the fourth embodiment of the invention.

Shown in FIG. 16 is semiconductor device 55 after performing an implant 58 that reduces the tensile stress of the exposed portion of dielectric layer 40 so that it becomes dielectric layer 60. This approach is particularly useful when it is desired that the P channel pull-up be somewhat tensile, to reduce the mobility, but not so tensile as for the N channel transistors. If the pull-up becomes too tensile, the read static noise margin can degrade. The result of the implant is still to have P channel pull-ups in the SRAM cells that have less mobility than the logic P channels and thus result in improved write margin or improved write speed.

Various changes and modifications to the embodiments herein chosen for purposes of illustration will readily occur to those skilled in the art. For example, the order of formation of dielectric layers can be changed. Instead of forming tensile layer 40 first, compressive layer 42 could be formed first. Also these embodiments have been shown using an SOI substrate but another substrate type, such as bulk or bulk-SOI hybrid, could also be used. To the extent that such modifications and variations do not depart from the spirit of the invention, they are intended to be included within the scope thereof which is assessed only by a fair interpretation of the following claims.

What is claimed is:

1. A method of making a semiconductor device comprising:

forming a first N channel transistor that is used in a logic circuit;

forming a first P channel transistor that is used in the logic circuit;

forming a second N channel transistor that is used in a SRAM array;

forming a second P channel transistor that is used in the SRAM array;

depositing a first dielectric layer over the semiconductor device that has a first stress;

removing the first dielectric layer over the first P channel transistor and leaving the first dielectric over the first N channel transistor, the second N channel transistor, and the first P channel transistor;

depositing a second dielectric layer over the semiconductor device that has a second stress that is more compressive than the first stress; and removing the second dielectric layer over the first and second N channel transistors and the second P channel transistor.

2. The method of claim 1 wherein the first stress is tensile, further comprising implanting into a first portion of the first dielectric layer that is over the second P channel transistor to cause the first portion of the first dielectric layer to become less tensile.

3. The method of claim 1 wherein the first stress is tensile, further comprising implanting into a first portion of the first dielectric layer that is over the second P channel transistor to cause the first portion of the first dielectric layer to become less tensile while blocking the implanting into the first dielectric layer over the first N channel transistor, the first P channel transistor, and the second N channel transistor.

* * * * *

UNITED STATES PATENT AND TRADEMARK OFFICE
CERTIFICATE OF CORRECTION

| | | |
|---|---|---|
| PATENT NO. | : 7,718,485 B2 | |
| APPLICATION NO. | : 11/754728 | |
| DATED | : May 18, 2010 | |
| INVENTOR(S) | : James D. Burnett and Jon D. Cheek | |

It is certified that error appears in the above-identified patent and that said Letters Patent is hereby corrected as shown below:

On the Title Page, Item (75), please change inventor name "Jon D. Cheel" to be --Jon D. Cheek--

Signed and Sealed this
Thirteenth Day of August, 2013

Teresa Stanek Rea
*Acting Director of the United States Patent and Trademark Office*